United States Patent
Shi et al.

(10) Patent No.: US 9,692,438 B2
(45) Date of Patent: Jun. 27, 2017

(54) SIGNAL PROCESSING, AMPLIFICATION MODULE, AN ANALOG TO DIGITAL CONVERTER MODULE

(71) Applicant: MediaTek Singapore Pte. Ltd., Singapore (SG)

(72) Inventors: Ming Shi, Hefei (CN); Jiangzhong Chen, Fangji Township, Funan County (CN)

(73) Assignee: MediaTek Singapore Pte. Ltd., Singapore (SG)

(*) Notice: Subject to any disclaimer, the term of this patent is extended or adjusted under 35 U.S.C. 154(b) by 0 days.

(21) Appl. No.: 15/287,952

(22) Filed: Oct. 7, 2016

(65) Prior Publication Data

US 2017/0104494 A1   Apr. 13, 2017

(30) Foreign Application Priority Data

Oct. 8, 2015 (CN) .......................... 2015 1 0646077

(51) Int. Cl.
*H03M 1/12* (2006.01)
*H03F 3/45* (2006.01)
*G01K 7/02* (2006.01)

(52) U.S. Cl.
CPC .......... *H03M 1/12* (2013.01); *H03F 3/45475* (2013.01); *G01K 7/02* (2013.01); *H03F 2203/45116* (2013.01)

(58) Field of Classification Search
CPC ...................................................... H03M 1/12
USPC ....................... 341/155, 139; 330/9, 253, 258
See application file for complete search history.

(56) References Cited

U.S. PATENT DOCUMENTS

| 4,851,842 A | 7/1989 | Iwamatsu | |
| 6,400,220 B1* | 6/2002 | Wang | H03F 3/45762 330/258 |
| 6,606,049 B1* | 8/2003 | Marble | H03F 3/70 327/124 |
| 6,673,420 B1* | 1/2004 | Muller | C09C 1/0015 106/31.13 |

(Continued)

OTHER PUBLICATIONS

"Quantization in ADCs;" Nov. 2016; pp. 1-6.

*Primary Examiner* — Peguy Jean Pierre
(74) *Attorney, Agent, or Firm* — McClure, Qualey & Rodack, LLP

(57) ABSTRACT

The present invention provides a signal-processing circuit including an amplification module and an analog-to-digital conversion module, wherein the amplification module includes a first input terminal for receiving an input signal, a second input terminal for receiving a reference signal, and an output terminal coupled to the analog-to-digital conversion module. Furthermore, the input signal and the reference signal are amplified by the amplification module individually, and an amplified signal is output to the analog-to-digital conversion module through the output terminal, and then the amplified signal undergoes analog-to-digital conversion by the analog-to-digital conversion module. The first amplification coefficient of which the input signal is amplified by the amplification module and the second amplification coefficient of which the reference signal is amplified by the amplification module are opposite in sign. The voltage range of the amplified signal is substantially equal to the scale of the analog-to-digital conversion module.

11 Claims, 7 Drawing Sheets

(56) References Cited

U.S. PATENT DOCUMENTS

| | | |
|---|---|---|
| 6,940,445 B2 | 9/2005 | Kearney |
| 7,884,745 B2 | 2/2011 | Eastty et al. |
| 7,928,721 B2* | 4/2011 | Yao ..................... G01R 15/125 |
| | | 324/123 C |
| 9,130,469 B2 | 9/2015 | Zhu |
| 9,148,602 B2 | 9/2015 | Ha |
| 2008/0048784 A1* | 2/2008 | Shih ......................... H03F 1/52 |
| | | 330/298 |
| 2010/0219890 A1* | 9/2010 | Crand ....................... H03F 3/19 |
| | | 330/188 |

* cited by examiner

SIGNAL PROCESSING, AMPLIFICATION MODULE, AN ANALOG TO DIGITAL CONVERTER MODULE

CROSS REFERENCE TO RELATED APPLICATION

The present application is based on, and claims priority of, Chinese Application 201510646077.0, filed on Oct. 8, 2015, the invention of which is hereby incorporated by reference herein in its entirety.

TECHNICAL FIELD

The present invention relates to communication technique, and in particular, to a signal-processing circuit.

BACKGROUND

Generally, an analog signal should be processed based on an analog-to-digital conversion in an electronic device, and then a processor of the electronic device can perform the subsequent operations based on the digital signal obtained through the analog-to-digital conversion. In particular, when an analog signal to be converted is small, the analog signal needs to be amplified. For example, in a typical detection device or detection system, the detection signal measured by a sensor is usually small, such as several hundred millivolts (mV); therefore, before being processed by the processor, the detection signal needs to be amplified and then analog-to-digital converted, to obtain the digital value corresponding to the amplified detection signal.

However, according to the prior art, if the conversion accuracy of an analog-to-digital converter is to be improved, then it needs to increase the bit number of the analog-to-digital converter, which increasing the cost.

SUMMARY

The signal-processing circuits of the present invention can improve the performance of the signal processing.

The present invention provides a signal-processing circuit comprising an amplification module and an analog-to-digital conversion module. The amplification module comprises a first input terminal for receiving an input signal; a second input terminal for receiving a reference signal; and an output terminal coupled to the analog-to-digital conversion module. The amplification module amplifies the input signal and the reference signal individually and outputs an amplified signal to the analog-to-digital conversion module through the output terminal, and the analog-to-digital conversion module performs an analog-to-digital conversion on the amplified signal. Furthermore, the amplification module amplifies the input signal by a first amplification coefficient and amplifies the reference signal by a second amplification coefficient, and the first amplification coefficient and the second amplification coefficient are opposite in sign (for example, the first amplification coefficient is positive and the second amplification coefficient is negative; or the first amplification coefficient is negative and the second amplification coefficient is positive). Moreover, the voltage range of the amplified signal is substantially equal to the scale of the analog-to-digital conversion module.

The signal-processing circuit amplifies the input signal received by the first input terminal and the reference signal received by the second input terminal respectively and outputs the amplified signal to the analog-to-digital conversion module through the output terminal, and then the analog-to-digital conversion module performs analog-to-digital conversion on the amplified signal output by the amplification module. Because the first amplification coefficient, which is used by the amplification module to amplify the input signal, and the second amplification coefficient, which is used by the amplification module to amplify the reference signal, are opposite in sign, the output voltage of the amplification module can be designed by modifying the values of the first amplification coefficient, the second amplification coefficient, and the reference signal. Furthermore, the voltage range of the amplified signal can be substantially equal to the conversion scale of the analog-to-digital conversion module, such that the accuracy of the analog-to-digital conversion can be improved or the bit number of the analog-to-digital converter can be reduced with the same accuracy of the analog-to-digital conversion, reducing the area and cost of the signal-processing circuit.

BRIEF DESCRIPTION OF THE DRAWINGS

The present disclosure can be more fully understood by reading the subsequent detailed description and examples with references made to the accompanying drawings, wherein.

DETAILED DESCRIPTION

The following descriptions are preferred embodiments of present invention. The embodiments disclosed herein are merely used to make examples to explain the features of the present invention and not intended to limit the scope of the present invention. In the present disclosure and appended claims, some terms are used to indicate specific components, and those skilled in the art should realize that manufacturers may use another words to describe the same component. The present disclosure and appended claims do not identify components based on different names of the components, but identify components according to different functions thereof. The terms "component," "system," and "device" may be an entity related to a computer, wherein the computer may be hardware, software, or the combination of hardware and software. The terms "include" and "comprise" mentioned in the present disclosure and appended claims are intended as "open" terms, so it should be interpreted as "including but not limited to." On the other hand, the term "couple" means directly or indirectly electrical connection. Therefore, if the present disclosure describes that a device is coupled to a second device, it means the device may be directly electrically coupled to the second device or indirectly electrically coupled to the second device through other devices or connection techniques.

The term "substantially" or "approximately" of the present disclosure means that those skilled in the art can overcome the problem and basically achieve performance within an acceptable range. For example, the phrase "substantially equal to" means that without affecting the correctness of the result, those skilled in the art can accept a case having a certain degree of error compared with the condition "exactly equal to."

Figure 1:
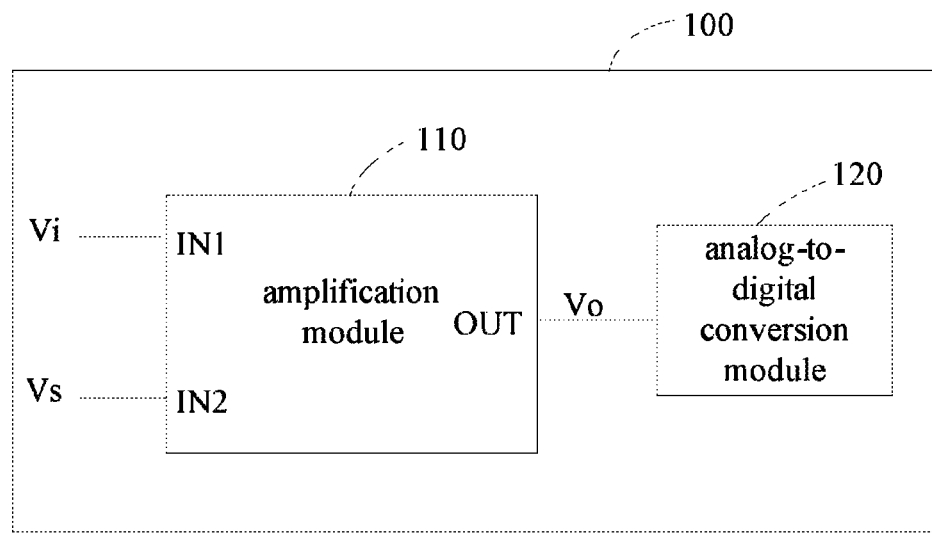
FIG. 1 shows a schematic diagram of a signal-processing circuit according to a first embodiment of the present disclosure.

FIG. 1 shows a schematic diagram of a signal-processing circuit according to a first embodiment of the present disclosure. The signal-processing circuit 100 comprises an amplification module 110 and an analog-to-digital conversion module 120. The amplification module 110 is coupled to the analog-to-digital conversion module 120.

In this embodiment, the amplification module 110 comprises a first input terminal IN1, a second input terminal IN2, and an output terminal OUT. The output terminal OUT is coupled to the analog-to-digital conversion module 120. The first input terminal IN1 is utilized to receive the input signal Vi. The second input terminal IN2 is utilized to receive the reference signal Vs. The output terminal OUT is utilized to output the amplified signal Vo to the analog-to-digital conversion module 120. The analog-to-digital conversion module 120 performs an analog-to-digital conversion on the amplified signal Vo output by the amplification module 110. In particular, the amplification module 110 amplifies the input signal Vi and the reference signal Vs respectively and outputs the amplified signal Vo to the analog-to-digital conversion module 120 through the output terminal OUT.

The amplification module 110 amplifies the input signal Vi by a first amplification coefficient and amplifies the reference signal Vs by a second amplification coefficient, wherein the first amplification coefficient and the second amplification coefficient are opposite in sign. Therefore, the signal-processing circuit 100 may modify the output voltage (i.e. the amplified signal Vo) of the amplification module by adjusting the values of the first amplification coefficient, the second amplification coefficient, and/or the reference signal, such that the voltage range of the amplified signal substantially equal to the scale of the analog-to-digital conversion module 120, improving the conversion accuracy of the analog-to-digital conversion and reduce cost. Additionally, the reference signal may be a voltage signal or a current signal. Specifically, the reference signal of the present invention is not limited. For convenience of description, the reference signal will be described as a voltage signal, for example.

It should be noted that "the voltage range of the amplified signal is substantially equal to the scale of the analog-to-digital conversion module 120" might means that: the voltage range of the amplified signal equals the conversion scale of the analog-to-digital conversion module 120 (that is, the upper and lower limits of the amplified signal Vo sent to the analog-to-digital conversion module 120 are equal to the upper and lower limits of the full scale of the analog-to-digital conversion module 120 respectively); or the difference between the conversion scale of the analog-to-digital conversion module 120 and the voltage range of the amplified signal is less than or equal to a predetermined value, wherein the predetermined value is an acceptable value in a practical design. For example, the predetermined value can be predetermined as the product of the upper limit of the scale (such as the full scale) and a predetermined percentage, such that the predetermined value be related with the scale of the analog-to-digital conversion module 120. The predetermined percentage may less than 50%, such as 30%, 20%, 10%, or the like. The smaller the predetermined percentage is set, the closer the voltage range of the amplified signal can approach the scale of the analog-to-digital conversion module 120, which improves the conversion accuracy of the analog-to-digital conversion while the resolution of the analog-to-digital conversion module remains the same. It should be noted that the present invention is not limited to a specific value of the predetermined percentage, and the predetermined percentage may be set according to the actual situation.

It should be understood that the amplification module 110 may include an operational amplifier. In one embodiment, such as that shown in FIG. 2A, the first input terminal IN1 may correspond to the non-inverting input terminal of the first operational amplifier A1, and the second input terminal IN2 may correspond to the inverting input terminal of the first operational amplifier A1. In this embodiment, the sign of the first amplification coefficient is positive, and the sign of the second amplification coefficient is negative. Similarly, in another embodiment, such as that shown in FIG. 2C, the first input terminal IN1 may correspond to the inverting input terminal of the first operational amplifier A1, and the second input terminal IN2 may correspond to the non-inverting input terminal of the first operational amplifier A1 (the operational amplifier A2 operates as a voltage follower). In the current embodiment, the sign of the first amplification coefficient is negative, and the sign of the second amplification coefficient is positive. Specifically, the present invention makes no limitations regarding the sign of the first or second amplification coefficient. It should be realized that a similar variation in other embodiments can be obtained based on the descriptions in FIGS. 2A and 2C; therefore, for the purpose of simplicity, the present disclosure will not describe all of them. To facilitate description, in the following description, the first input terminal corresponds to the non-inverting input terminal of the operational amplifier and the second input terminal corresponds to the inverting input terminal of the operational amplifier.

In the signal-processing circuit of the embodiments mentioned above, the amplification module amplifies the input signal received by the first input terminal and the reference signal received by the second input terminal respectively and outputs the amplified signal to the analog-to-digital conversion module through the output terminal, and then the analog-to-digital conversion module performs analog-to-digital conversion on the amplified signal output by the amplification module. Because the first amplification coefficient for the input signal and the second amplification coefficient for the reference signal are opposite in sign, the output voltage output to the analog-to-digital conversion module through the output terminal of the amplification module can be designed by adjusting the values of the first amplification coefficient, the second amplification coefficient, and/or the reference signal, and hence the conversion accuracy of analog-to-digital conversion can be improved. In one specific embodiment, the circuit structure based on the present invention can make the voltage range of the amplified signal, which is output by the output terminal of the amplification module, substantially equal to or approaching the conversion scale of the analog-to-digital conversion module, such that the scale of the analog-to-digital conversion module may be fully utilized, thus improving the conversion accuracy of the analog-to-digital conversion, or the bit number of the analog-to-digital converter may be reduced under the same conversion accuracy, thus further reducing the circuit area, power consumption, and cost of the signal-processing circuit.

Figure 2A:
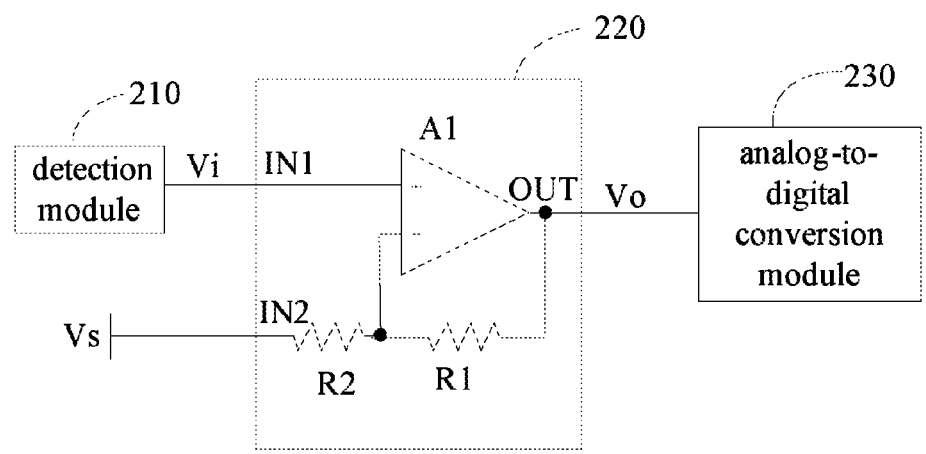
FIG. 2A shows a schematic diagram of a signal-processing circuit according to a second embodiment of the present disclosure.

FIG. 2A shows a schematic diagram of a signal-processing circuit according to the second embodiment of the present disclosure. In this embodiment, a detection module 210 is added, and the amplification module 220 specifically includes the first operational amplifier A1, the first resistor R1, and the second resistor R2. The detection module 210 is coupled to the amplification module 220, and the amplification module 220 is coupled to the analog-to-digital conversion module 230. The first operational amplifier A1 includes the non-inverting input terminal receiving an input signal Vi, the inverting input terminal coupled to the first terminal of the first resistor R1 and the second terminal of the second resistor R2, and the output terminal outputting the amplified signal Vo to the analog-to-digital conversion module 230. The second terminal of the first resistor R1 is coupled to the output terminal of the first operational amplifier A1. The first terminal of the second resistor is used to receive the reference signal Vs, and the reference signal Vs is supplied by a voltage source (which is not shown in FIG. 2A). It should be noted that the voltage source may be provided within the amplification module. Specifically, the present invention makes no limitations regarding the arrangement of the voltage source.

It should be realized that the first input terminal IN1 of the amplification module 220 corresponds to the non-inverting input terminal of the first operational amplifier A1; the second input terminal IN2 of the amplification module 220 corresponds to the first terminal of the second R2; and the output terminal OUT of the amplification module 220 corresponds to the output terminal of the first operational amplifier A1.

The detection module 210 is used to process the signal measured by a sensor and generate the input signal Vi. In one embodiment, the detection module 210 may be a temperature-detection module, a humidity-detection module, or a pressure-detection module, or it can be another type of detection module in a specific implementation. It should be noted that the present invention is not limited to any specific type of detection module. In particular, these detection modules measure the physical value (such as temperature, humidity, pressure, etc.) through a sensor and transform the physical value into a weak voltage signal, and then output the weak voltage signal. For example, in a typical temperature-detection system, the temperature-detection module outputs a voltage signal which is about 0.5V to 0.8V. The amplification module 220 is used to amplify the input signal Vi received by the first input terminal IN1 and the reference signal Vs received by the second input terminal IN2, obtain the amplified signal Vo, and output the amplified signal Vo to the analog-to-digital conversion module through the output terminal OUT. Furthermore, the analog-to-digital conversion module 230 is used to perform the analog-to-digital conversion on the amplified signal output by the amplification module 220.

In this embodiment, the amplification module 220 amplifies the input signal Vi by a first amplification coefficient and amplifies the reference signal Vs by a second amplification coefficient, wherein the first amplification and the second amplification are opposite in sign. Moreover, the voltage range of the amplified signal Vo is substantially equal to the scale of the analog-to-digital conversion module 230, and the specific circuit arrangement will be described in detail later.

Figure 2B:
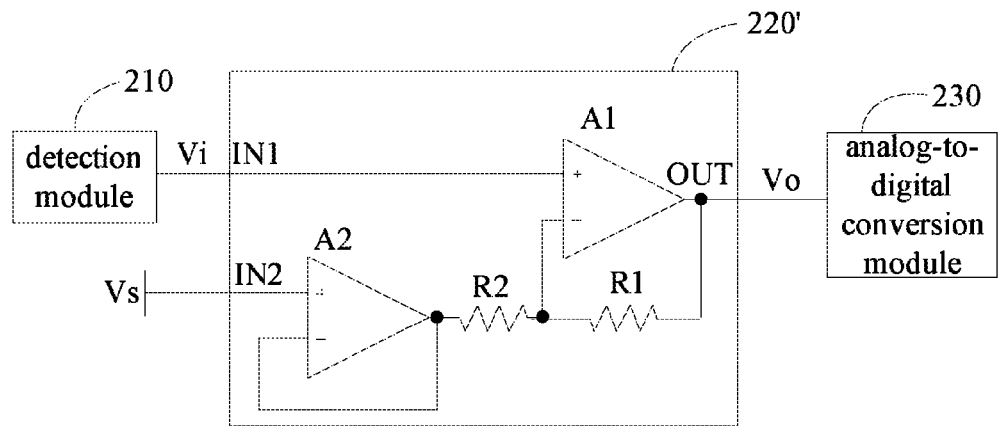
FIG. 2B shows a schematic diagram of a signal-processing circuit according to a third embodiment of the present disclosure.

FIG. 2B shows a schematic diagram of a signal-processing circuit according to the third embodiment of the present disclosure. The differences between this embodiment and the second embodiment include that the amplification module 220' further includes the voltage follower circuit (such as the arrangement of the second operational amplification A2). The non-inverting input terminal of the second operational amplifier A2 is used to receive the reference signal Vs, and the inverting input terminal and the output terminal of the second operational amplifier A2 are coupled to each other. In this embodiment, the first terminal of the second resistor R2 is coupled to the output terminal of the second operational amplifier A2, and the reference signal Vs is supplied by a voltage source, which is not shown in FIG. 2B.

Based on the circuit connection and structure of the second operational amplifier A2, the second operational amplifier A2 operates as a voltage follower circuit, and the voltage of its output terminal always equals the reference signal Vs received by its non-inverting input terminal. Therefore, the reference signal Vs is effectively input to the inverting terminal of the first operational amplifier A1 without being affected by external circuit. Accordingly, the conversion accuracy and precision of the analog-to-digital conversion can be improved further based on the embodiment in FIG. 2B.

Figure 2C:
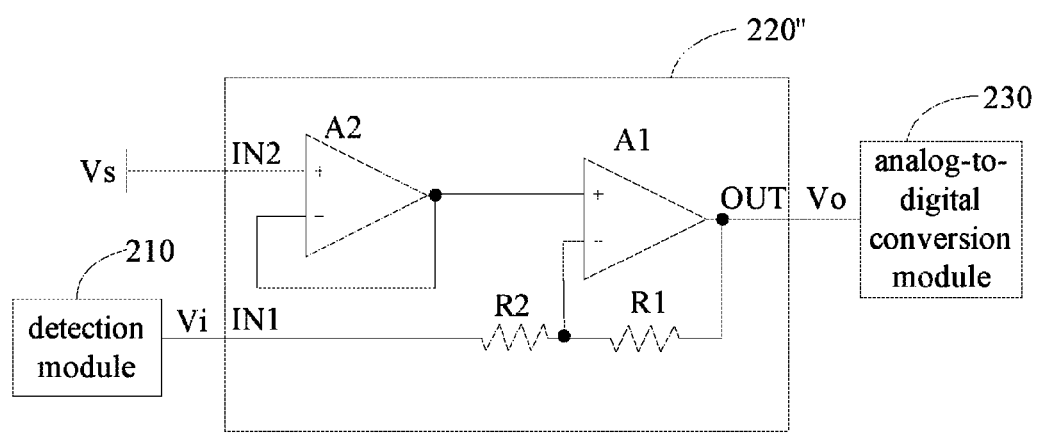
FIG. 2C shows another schematic diagram of a signal-processing circuit according to FIG. 2B.

It should be understood that in an embodiment based on FIG. 2B, the first input terminal IN1 of the amplification module may correspond to the non-inverting input terminal of the first operational amplifier A1, and the second input terminal IN2 of the amplification module may correspond to the inverting input terminal of the first operational amplifier A1 (the second operational amplifier A2 operates as a voltage follower circuit). FIG. 2C is a schematic diagram of a signal-processing circuit based on FIG. 2B. As the amplification module 220" shown in FIG. 2C, the non-inverting input terminal of the first operational amplifier A1 receives the reference signal Vs through the voltage follower (i.e. the second operational amplifier A2), and the inverting input terminal of the first operational amplifier A1 is coupled to the detection module 210 through the resistor R2 and coupled to the output terminal OUT of the amplification module 220" through the resistor R1. In the embodiment shown in FIG. 2C, the detection module 210 may include a buffer circuit (such as a voltage follower circuit, and the input terminal of the voltage follower circuit receives the input signal) to improve the driving ability. FIGS. 2A and 2B can be referred to for further details; therefore, for the purpose of simplicity, details will not be described again in the present disclosure.

In one embodiment, which refers to FIGS. 2A and 2B, the output signal (i.e. the amplified signal Vo) obtained from the result of the amplification module 220 or amplification module 220' amplifying the input signal Vi and the reference signal Vs can be defined using equation (1).

$$Vo = \left(\frac{R1}{R2} + 1\right) * Vi - \frac{R1}{R2} * Vs = A1 * Vi + A2 * Vs \qquad (1)$$

Wherein $$\left(\frac{R1}{R2} + 1\right),$$

A1 are the first amplification coefficient, and $$-\frac{R1}{R2},$$

A2 are the second amplification coefficient. In the embodiments shown in FIGS. 2A and 2B, A1 can be defined as A1=−A2+1. It should be noted that the present invention does not limit A1 to a specific equation.

Similarly, as shown in FIG. 2C, the output signal Vo obtained from the result of the amplification module 220 may be defined by:

$$Vo = \left(1 - \frac{R1}{R2}\right) \times Vs - \frac{R1}{R2} \times Vi = A1 \times Vi + A2 \times Vs$$

To facilitate description, the bit number of the analog-to-digital conversion module is assumed to be N, and the full scale of the analog-to-digital conversion module is assumed to be $V_{REFP}$. In these cases, the resolution of the analog-to-digital conversion module is $$\frac{V_{REFP}}{2^N}.$$

Accordingly, the conversion accuracy P of the analog-to-digital conversion performed on the input signal Vi by the analog-to-digital conversion module can be defined using equation (2).

$$P = \frac{V_{REFP}}{2^N * A} \qquad (2)$$

N is a positive integer, and A is the amplification coefficient used to amplify the input signal Vi by the amplification module; that is, A is the first amplification coefficient.

In particular, in a detection system, the input signal Vi generated by the detection module and the physical signal (such as temperature) measured by the sensor (such as thermistor, thermocouple, etc.) have a linear correlation, and the conversion accuracy P corresponding to the physical signal (such as temperature) is defined as $$P = \frac{V_{REFP}}{2^N * A * \lambda},$$

wherein the coefficient λ is a ratio or the absolute value of the ratio between the input signal Vi and the detected physical signal.

Figure 3A:
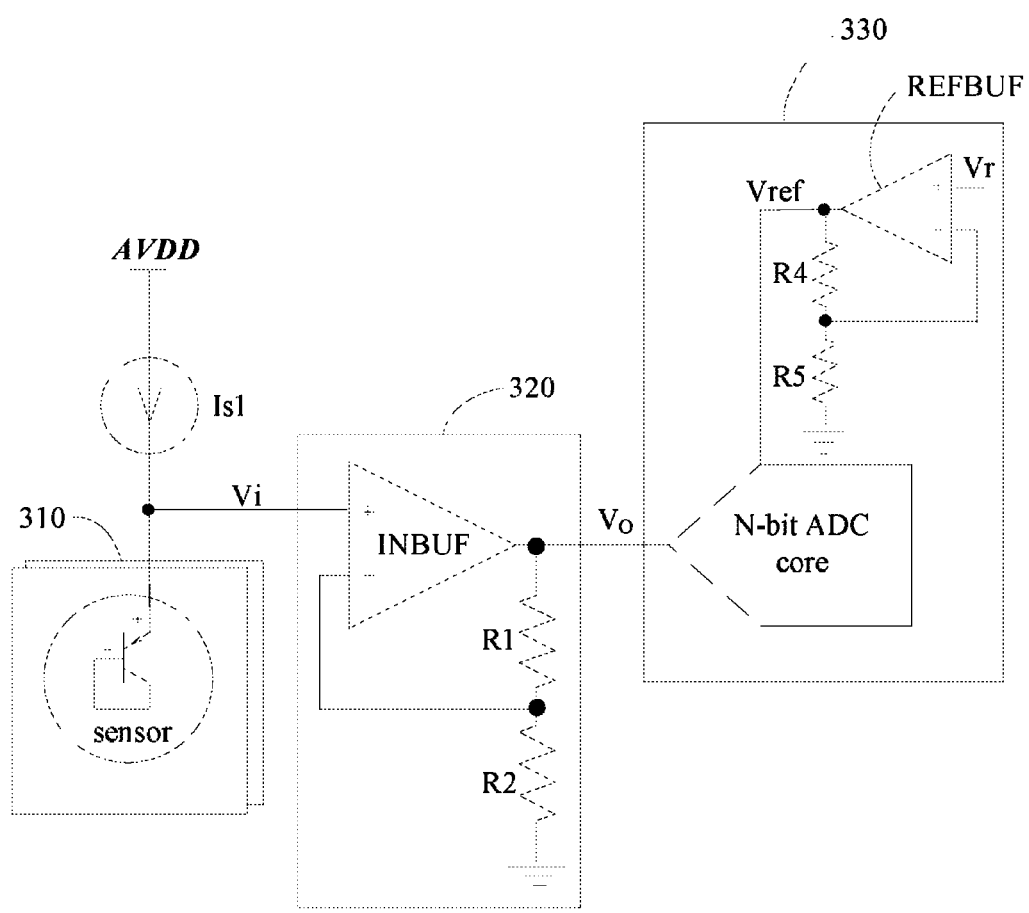
FIG. 3A shows a schematic diagram of a temperature-detection system according to an embodiment of the present disclosure.

To facilitate understanding, the temperature-detection system is used as an example. FIG. 3A shows a schematic diagram of a temperature-detection system according to an embodiment of the present disclosure. The current source Is1 is coupled between the first voltage AVDD and the temperature-detection module 310 (which can be implemented by a sensor as shown in FIG. 3A). The temperature-detection module 310 is coupled to the amplification module 320, and the amplification module 320 is coupled to the analog-to-digital conversion module 330. In particular, the analog-to-digital conversion module 330 may be an analog-to-digital converter (ADC). The temperature-detection module 310 transforms the temperature measured by the sensor component into a voltage value (i.e. the input signal Vi) and outputs the input signal Vi to the amplification module 320. The amplification module 320 amplifies the input signal Vi and outputs the amplified signal Vo to the analog-to-digital conversion module to perform the analog-to-digital conversion.

As shown in FIG. 3A, the amplification module 320 comprises the operational amplifier INBUF, resistor R1, and resistor R2. The non-inverting input terminal of the operational amplifier INBUF is used to receive the input signal Vi. The inverting input terminal and the output terminal of the operational amplifier INBUF are coupled to each other through the resistor R1, and the inverting input terminal is coupled to the ground terminal through the resistor R2. Moreover, the analog-to-digital conversion module 330 comprises a N-bit ADC core (also known as the analog-to-digital converter core), an operational amplifier REFBUF, resistor R4, and resistor R5. The non-inverting input terminal of the operational amplifier REFBUF is used to receive the supply voltage Vr provided by the reference voltage source (which is not shown in FIG. 3A). The inverting input terminal of the operational amplifier REFBUF is coupled to the ground terminal through the resistor R5 and coupled to the output terminal of the operational amplifier REFBUF through the resistor R4. As the circuit structure shown in FIG. 3A, the output terminal of the operational amplifier REFBUF is utilized to supply the reference voltage Vref to the N-bit ADC core, wherein the reference voltage Vref corresponds to the full scale $V_{REFP}$ of the analog-to-digital converter (such as the N-bit ADC core or the analog-to-digital conversion module 330). For example, in one embodiment, if the full scale $V_{REFP}$ of the analog-to-digital converter is 2.8V, the circuit consisting of the operational amplifier REFBUF, resistors R4 and R5 is used to supply the reference voltage Vref, which is 2.8V, according to the supply voltage Vr. Based on the circuit structure shown in FIG. 3A, the output signal Vo obtained by the amplification module 320 can be defined using equation (3).

$$Vo = \left(\frac{R1}{R2} + 1\right) * Vi \qquad (3)$$

Figure 3B:
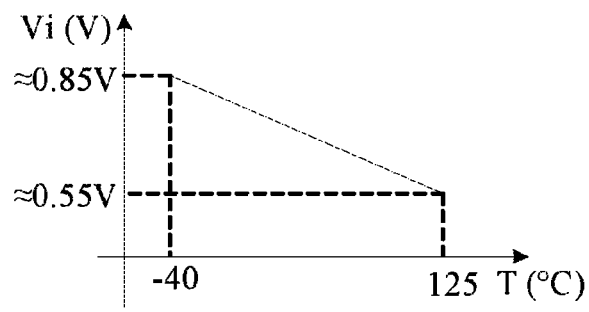
FIG. 3B shows a graphical representation of an input signal based on the system in FIG. 3A.

To facilitate description, FIG. 3B shows a graphical representation of an input signal based on the system in FIG. 3A. As shown in FIG. 3B, the horizontal axis is used to represent temperature T in units of ° C., and the vertical axis is used to represent the input signal Vi in units of V. In this embodiment, the input signal Vi and the temperature value are inversely proportional to each other. In particular, the range of the temperature values is from −40° C. to 125° C., and the voltage range of the input signal Vi is from 0.55V to 0.85V, wherein $$\lambda = \left\| \frac{0.85 - 0.55}{-40 - 125} \right\| \approx 0.0018 (V/°C.).$$

For the known or given analog-to-digital conversion module and detection module (such as the temperature-detection module), the bit number, scale of the analog-to-digital conversion module, and the coefficient λ are fixed. In one embodiment, the conversion accuracy P of the input signal Vi or the physical signal (such as temperature) performed by the analog-to-digital conversion module can be improved by increasing the amplification coefficient A of the input signal Vi.

Figure 3C:
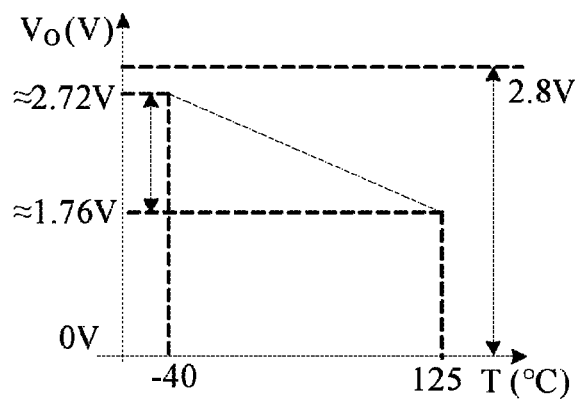
FIG. 3C shows a graphical representation of an amplified signal based on the system in FIG. 3A.

To facilitate description, the illustration below is based on the embodiment mentioned above. The full scale of the analog-to-digital conversion module is 2.8V, and the voltage range of the input signal Vi is 0.55V to 0.85V. However, it should be noted that the present invention is not limited by the above limitations. As the circuit structure shown in FIG. 3A, when the amplification coefficient $$\left( \frac{R1}{R2} + 1 \right)$$

of the input signal Vi is 3.29, the voltage range of the output signal Vo is 1.8V to 2.8V. However, if the amplification coefficient increases continuously, it will lead to a situation where the voltage range of the amplified signal Vo exceeds the scale of the analog-to-digital converter, and the analog-to-digital converter cannot perform the analog-to-digital conversion on the portion of the amplified signal exceeding the scale, which degrades the conversion accuracy of the analog-to-digital conversion. For example, if the amplification coefficient $$\left( \frac{R1}{R2} + 1 \right)$$

is set at 4 for the circuit structure in FIG. 3A, the voltage range of the output voltage Vo is 2.2V to 3.4V. The analog-to-digital conversion module 330 is not able to perform the conversion on the portion of the output signal within 2.8V to 3.4V, and hence the conversion accuracy of the analog-to-digital conversion is degraded. Therefore, regarding the circuit structure in FIG. 3A, if the conversion accuracy is expected to be improved further, the bit number N of the analog-to-digital converter should be increased. However, the greater the increase of the bit number N, the higher the cost and power that is needed, and the area of the circuit also increases. FIG. 3C shows a graphical representation of an amplified signal based on the system in FIG. 3A. As shown in FIG. 3C, the horizontal axis is used to represent temperature T, and the vertical axis is used to represent the amplified signal Vo. When the amplification coefficient is 3.2, the voltage rage of the amplified signal Vo is 1.76V to 2.72V. Accordingly, most of the scale, which is the voltage from 0V to 1.76V, is not utilized.

In some embodiments of the present invention, the amplified signal can be guaranteed within the scale (such as 0V to 2.8V) which is $0 \leq V_O \leq V_{REFP}$. In one embodiment, the voltage range of the input signal Vi is between the first threshold value TH1 and the second threshold value TH2 greater than the first threshold value TH1, and the second threshold value TH2 is less than or equal to (i.e. no more than) the full scale of the analog-to-digital conversion module. In one embodiment, the product of the first amplification coefficient A1 and the threshold difference (which is the difference between the second threshold value TH2 and the first threshold value TH1; that is, TH2-TH1) is less than the full scale $V_{REFP}$. In other words, $$A1 \leq \frac{V_{REFP}}{TH2 - TH1},$$

and hence the first amplification coefficient has an upper limit of $$\frac{V_{REFP}}{TH2 - TH1}.$$

Furthermore, the value of the amplified signal Vo is within the scale of the analog-to-digital conversion module, resulting $0 \leq A1*TH1+A2*Vs \leq V_{REFP}$ and $0 \leq A1*TH2+A2*Vs \leq V_{REFP}$. Accordingly, the voltage range of the amplified signal Vo can be substantially equal to the scale range when the values of the first amplification coefficient A1, the second amplification coefficient A2 and/or the reference signal Vs are set appropriately (i.e. A1*TH1+A2*Vs is close to 0, and A1*TH2+A2*Vs is closed to $V_{REFP}$), such that the conversion accuracy of the analog-to-digital conversion can be improved by efficiently utilizing the scale of the analog-to-digital converter. It should be realized that there might be multiple sets of the first amplification coefficients, the second amplification coefficients, and the reference signals that satisfy the requirements mentioned above. Specifically, one appropriate parameter set (such as cases where the first amplification coefficient A1 is large) of the multiple sets, consisting of the first amplification coefficients, the second amplification coefficients, and the reference signals can be selected according to needs of the actual design. For example, the selected parameter set may include a first amplification coefficient which corresponds to the upper limit. In other words, an acceptable tolerance range can be allowed to exist between the selected first amplification coefficient and the upper limit. The acceptable tolerance range, which is allowed to exist, can be determined in a specific implementation. Specifically, the present invention makes no limitations regarding the acceptable tolerance range. In another embodiment, the full scale of the analog-to-digital conversion module is larger than 1V; the first threshold value TH1 is greater than 0; and the second threshold value TH2 is less than 1. For example, the first threshold value TH1 and the second threshold value TH2 are 0.55 and 0.85, respectively, in the embodiment shown in FIG. 3B.

Figure 3D:
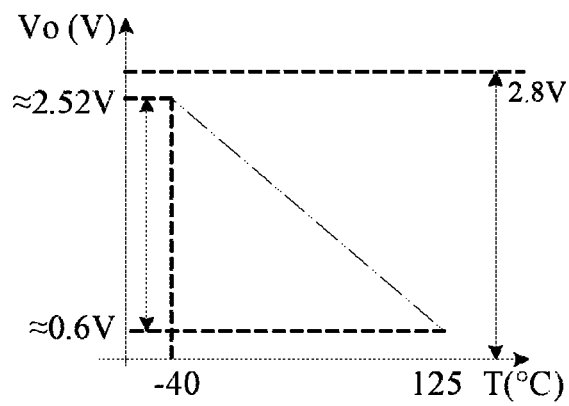
FIG. 3D shows a graphical representation of an amplified signal based on the system in FIG. 2A or FIG. 2B.

To facilitate understanding, an exemplary parameter set is provided, such as the reference signal Vs is 0.54V; the first amplification coefficient is 6.4; and the second amplification coefficient is −5.4. FIG. 3D shows a graphical representation of the amplified signal Vo based on the description in FIG. 2A or FIG. 2B. As shown in FIG. 3D, the voltage range of the amplified signal Vo is 0.6V to 2.52V. To compare FIG. 3D with FIGS. 3A and 3C, the amplification coefficient of the input signal Vi is doubled; that is, the analog-to-digital conversion accuracy of the input signal and the physical signal (such as temperature) corresponding to the input signal is doubled. Accordingly, if the analog-to-digital conversion accuracy is not changed based on the original condition, the bit number of the analog-to-digital converter can be reduced, and hence the cost, power consumption and the circuit area can also be reduced. It should be noted that the embodiments mentioned above are used merely for illustration, and should not be used to limit the scope of the present invention. For example, in another embodiment, the reference signal Vs can be set as 0.61V; the first amplification coefficient can be set as 9; and the second coefficient can be set as −8. Accordingly, the voltage range of the amplified signal Vo is from 0.07V to 2.77V, and hence the analog-to-digital conversion accuracy is increased 2.8 times (9/3.2 is approximately equal to 2.8) that of the prior art. It should be noted that, in some embodiments, when the voltage range of the amplified signal Vo is substantially equal to the scale of the analog-to-digital conversion module, the first amplification coefficient can be substantially equal to the upper limit $$\frac{V_{REFP}}{TH2-TH1}$$

by adjusting the second amplification coefficient A2 and the reference signal, which can improve the analog-to-digital conversion accuracy as much as possible.

In the above embodiments, since the first amplification coefficient for amplifying the input signal and the second amplification coefficient for amplifying the reference signal are opposite in sign, the voltage output to the analog-to-digital module through the output terminal of the amplification module can be designed by modifying the values of the first amplification coefficient, the second amplification coefficient, and the reference signal. Accordingly, the larger first amplification coefficient can be obtained when the voltage range of the amplified signal output by the amplification module is substantially equal to the scale of the analog-to-digital conversion module. Based on the embodiments of the present invention, the scale of the analog-to-digital conversion module can be utilized efficiently, which ensures that the conversion accuracy of the analog-to-digital conversion can be improved and reduces measurement error.

Figure 4:
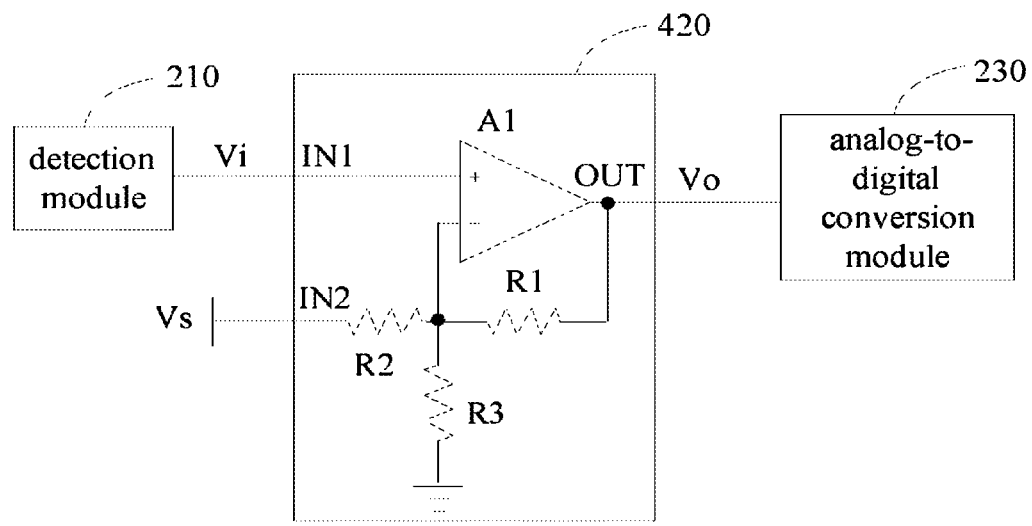
FIG. 4 shows a schematic diagram of a signal-processing circuit according to a fourth embodiment of the present disclosure.

FIG. 4 shows a schematic diagram of a signal-processing circuit according to a fourth embodiment of the present disclosure. The difference between FIG. 4 and FIG. 2A is that a resistor R3 is added to the amplification module 420. The first terminal of the resistor R3 is coupled to the first terminal of the resistor R1, and the second terminal of the resistor R3 is coupled to ground. The rest of the details of the circuit can be found in the second embodiment, and for the purpose of simplicity, details will not be described again in the present disclosure.

Figure 5:
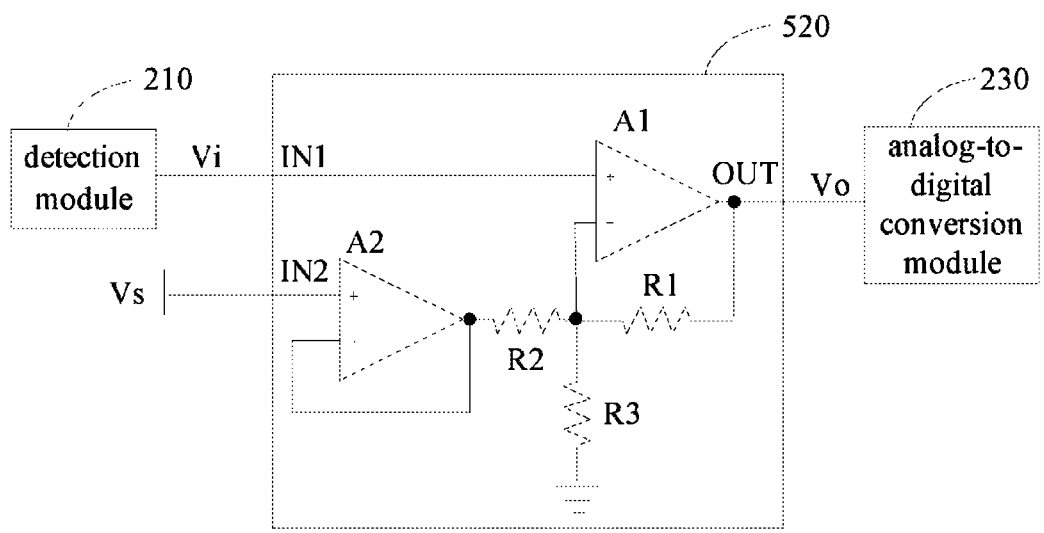
FIG. 5 shows a schematic diagram of a signal-processing circuit according to a fifth embodiment of the present disclosure.

FIG. 5 shows a schematic diagram of a signal-processing circuit according to a fifth embodiment of the present disclosure. The difference between FIG. 5 and FIG. 4 is that the voltage follower (such as the second operational amplifier A2) is added to the amplification module 520. The non-inverting input terminal of the second operational amplifier A2 is used to receive the reference signal Vs, and the inverting input terminal and the output terminal of the second operational amplifier A2 are coupled to each other. The first terminal of the second resistor R2 is coupled to the output terminal of the second operational amplifier A2. The rest of the details of the circuit can be found in the description of the third and fourth embodiments.

Based on the circuit structure in FIGS. 4 and 5, the amplified signals Vo of the amplification module 420 and 520 can be defined using the equation (4).

$$Vo = \left(\frac{R1}{R3} + \frac{R1}{R2} + 1\right)*Vi - \frac{R1}{R2}*Vs = A1*Vi + A2*Vs \quad (4)$$

$$\left(\frac{R1}{R3} + \frac{R1}{R2} + 1\right)$$

and A1 are the first amplification coefficient.

$$-\frac{R1}{R2}$$

and A2 are the second amplification coefficient. It should be noted that, based on the circuit structure in FIG. 4 or 5, conversion accuracy can be improved by designing the first amplification coefficient A1 and the second amplification coefficient A2 to be more flexible.

In the fourth and fifth embodiments, the voltage range of the output terminal of the amplification module can be substantially equal to the scale of the analog-to-digital conversion module by adjusting the resistance of the resistors R1, R2, R3, and the voltage of the reference signal Vs. Furthermore, conversion accuracy can be improved. The specific circuit details can be found in the descriptions of FIGS. 2A and 2B, and for the purpose of simplicity, the relevant details of this embodiment will not be described again.

Figure 6:
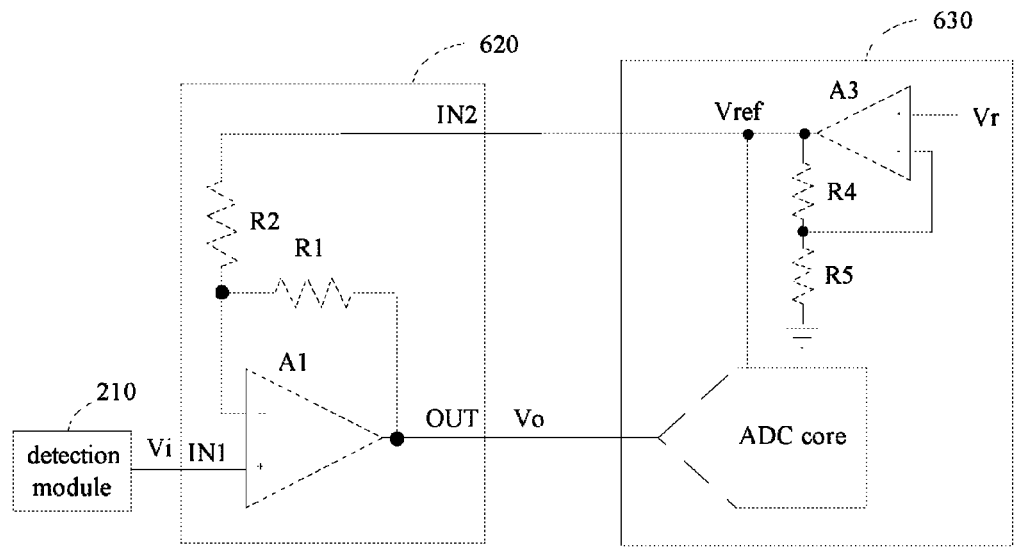
FIG. 6 shows a schematic diagram of a signal-processing circuit according to a sixth embodiment of the present disclosure.

FIG. 6 shows a schematic diagram of a signal-processing circuit according to a sixth embodiment of the present disclosure. The signal-processing circuit of this embodiment comprises the detection module 210, the amplification module 620, and the analog-to-digital conversion module 630. The detection module 210 is coupled to the amplification module 620. The amplification module 620 is coupled to the analog-to-digital conversion module 630.

The amplification module 620 includes the first operational amplifier A1, the first resistor R1, and the second resistor R2. The non-inverting input terminal of the first operational amplifier A1 is used to receive the input signal Vi. The inverting input terminal of the first operational amplifier is coupled to the first terminal of the first resistor R1 and the second terminal of the second resistor R2. The output terminal of the first operational amplifier is coupled to the second terminal of the first resistor R1. The output terminal of the first operational amplifier is used to output the amplified signal Vo to the analog-to-digital conversion module 630. The input signal Vi is provided by the detection module 210. It should be realized that in this embodiment, the first input terminal IN1 of the amplification module 620 is the non-inverting input terminal of the first operational amplifier A1; the second input terminal IN2 of the amplification module 620 is the first terminal of the second resistor R2; and the output terminal OUT of the amplification module 620 is the output terminal of the first operational amplifier A1.

The analog-to-digital conversion module 630 comprises a third operational amplifier A3, an ADC core, a fourth resistor R4, and a fifth resistor R5. The third operational amplifier A3 includes the non-inverting input terminal for receiving the supply voltage Vr provided by the reference voltage source (which is not shown in FIG. 6); the inverting input terminal connected to the second terminal of the fourth resistor R4; and the output terminal coupled to the ADC core for supplying the reference voltage Vref to the ADC core. The first terminal of the fourth resistor R4 is coupled to the output terminal of the third operational amplifier A3. The second terminal of the fourth resistor R4 is coupled to ground through the fifth resistor R5.

In one embodiment, the reference signal Vs is provided by the reference voltage Vref. In other words, the output terminal of the third operational amplifier A3 is coupled to the first terminal of the second resistor R2. It should be noted that, in a specific implementation, the reference voltage Vref can be processed (such as be reduced or be increased) before being coupled to the first terminal of the second resistor R2 according to the actual requirement. For example, if the reference signal Vs and the reference voltage Vref are 0.61V and 2.8V, respectively, the reference voltage Vref is processed to be reduced, but the present invention is not limited by this case.

Figure 7:
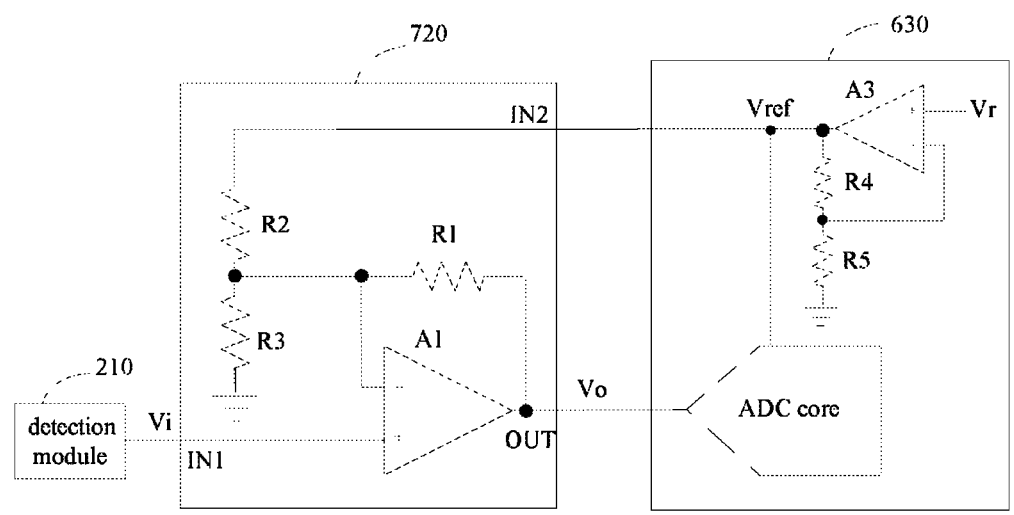
FIG. 7 shows a schematic diagram of a signal-processing circuit according to a seventh embodiment of the present disclosure.

FIG. 7 shows a schematic diagram of a signal-processing circuit according to a seventh embodiment of the present disclosure. The difference between this embodiment and the sixth embodiment is that a third resistor R3 is added to the amplification module 720. The first terminal of the third resistor R3 is coupled to the first terminal of the first resistor R1. The second terminal of the resistor R3 is coupled to ground. For the purpose of simplicity, the relevant details of this embodiment will not be described again.

In the embodiments in FIGS. 6 and 7, the reference voltage of the analog-to-digital conversion module is utilized to supply the reference signal Vs to the second input terminal IN2 of the amplification module, which makes the amplification module and the analog-to-digital conversion module share the same voltage source. Therefore, the voltage source used for supplying the reference signal Vs can be omitted, and the implementation cost of the entire system can be reduced.

Figure 8:
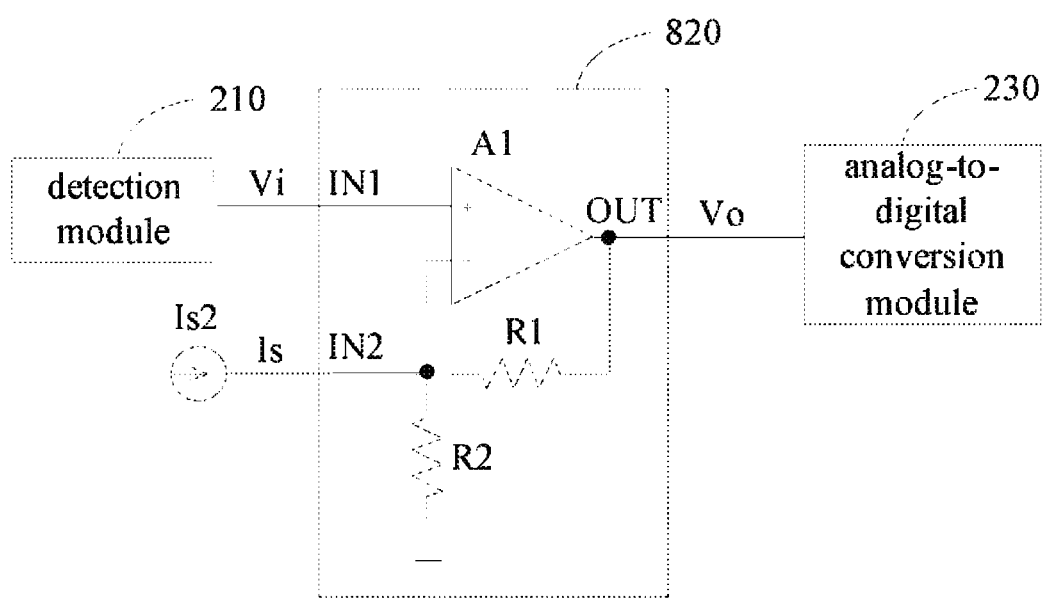
FIG. 8 shows a schematic diagram of a signal-processing circuit according to an eighth embodiment of the present disclosure.

FIG. 8 shows a schematic diagram of a signal-processing circuit according to an eighth embodiment of the present disclosure. The signal-processing circuit comprises the detection module 210, the amplification module 820, and the analog-to-digital conversion module 230. The detection module 210 is coupled to the amplification module 820. The amplification module 820 is coupled to the analog-to-digital conversion module 230.

The amplification module 820 includes the first operational amplifier A1, the first resistor R1, and the second resistor R2. The first operational amplifier A1 comprises the non-inverting input terminal for receiving the input signal Vi; the inverting input terminal coupled to the first terminal of the first resistor R1 and the second terminal of the second resistor R2; and the output terminal used to output the amplified signal Vo to the analog-to-digital conversion module 230. The second terminal of the first resistor R1 is coupled to the output terminal of the first operational amplifier A1. The first terminal of the first resistor R1 and the first terminal of the second resistor R2 are further used to receive the reference signal Is. The second terminal of the second resistor R2 is coupled to ground. In this embodiment, the reference signal Is is a current signal supplied by the current source Is2. It should be noted that the current source can be arranged in the amplification module 820.

It should be realized that in this embodiment, the first input terminal IN1 of the amplification module 820 corresponds to the non-inverting input terminal of the first operational amplifier A1; the second input terminal IN2 of the amplification module 820 corresponds to the inverting input terminal of the first operational amplifier A1; and the output terminal OUT of the amplification module 820 is the output terminal of the first operational amplifier A1. The amplified signal Vo can be defined by the equation (5).

$$Vo = \left(\frac{R1}{R2} + 1\right) * Vi - R1 * Is = A1 * Vi + A2 * Is \quad (5)$$

$$\left(\frac{R1}{R2} + 1\right)$$

and A1 are the first amplification coefficient. −R1 and A2 are the second amplification coefficient. The rest of the details of the circuit can be found in the embodiments of FIGS. 2A and 2B, and the relevant details of this embodiment will not be described again.

In this embodiment, the voltage range of the output signal Vo can be substantially equal to the scale by adjusting the resistance of the resistors R1, R2, and the current of the current signal Is provided by the current source, and a larger first amplification coefficient can be obtained. Furthermore, conversion accuracy can be improved. Moreover, in some embodiments, the input signal Vi can be sent to the amplification module through a buffer circuit, such as a voltage follower.

In the embodiments mentioned above, the signal-processing circuit comprises an amplification module and an analog-to-digital conversion module. The analog-to-digital conversion module is used to perform analog-to-digital conversion on the amplified signal output by the amplification module. The amplification module receives the input signal and the reference signal through the first input terminal and the second input terminal, respectively. The amplification module amplifies the input signal by a first amplification coefficient and amplifies the reference signal by a second amplification coefficient, and the first amplification coefficient and the second amplification coefficient are opposite in sign. Therefore, the voltage value of the amplified signal output by the amplification module can be designed by adjusting the values of the first amplification coefficient, the second amplification coefficient, and the reference signal, which makes the voltage range of the amplified signal being substantially equal to the scale of the analog-to-digital conversion module. Accordingly, conversion accuracy can be improved by appropriately utilizing the scale of the analog-to-digital conversion module (such as the conversion accuracy of the embodiment in FIG. 3D being two times more accurate than that of the embodiment in FIG. 3C) rather than increasing the bit number of the analog-to-digital conversion module. Furthermore, the signal-processing circuit of the present invention can also reduce the bit number of the analog-to-digital converter when the analog-to-digital conversion accuracy is guaranteed (such as the embodiment in FIG. 3D, the bit number of the analog-to-digital converter can be reduced by one bit with the same conversion accuracy as the embodiment in FIG. 3C), and hence the circuit area, power consumption, and cost can be reduced. In particular, the reference signal received by the second input terminal of the amplification module can be supplied by the reference voltage of the analog-to-digital conversion module, and the voltage source which is used to provide the reference signal can be omitted since the amplification module and the analog-to-digital conversion module use the same voltage source; therefore, the power consumption and cost can be reduced further.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal-processing circuit, comprising an amplification module and an analog-to-digital conversion module, wherein the amplification module comprises:
    a first input terminal, receiving an input signal;
    a second input terminal, receiving a reference signal; and
    an output terminal, coupled to the analog-to-digital conversion module;
    wherein the amplification module is arranged to amplify the input signal by a first amplification coefficient and amplify the reference signal by a second amplification coefficient respectively, and further to output an amplified signal to the analog-to-digital conversion module through the output terminal, and the analog-to-digital conversion module is configured to perform an analog-to-digital conversion on the amplified signal;
    wherein the first amplification coefficient and the second amplification coefficient are opposite in sign;
    wherein a voltage range of the amplified signal is substantially equal to a conversion scale of the analog-to-digital conversion module.

2. The signal-processing circuit as claimed in claim 1, further comprising a detection module for processing a signal measured by a sensor and generates the input signal.

3. The signal-processing circuit as claimed in claim 2, wherein the detection module is a temperature-detection module, a humidity-detection module, or a pressure-detection module.

4. The signal-processing circuit as claimed in claim 1, wherein the amplification module further comprises a first operational amplifier, a first resistor, and a second resistor;
    wherein the first operational amplifier comprises:
        a non-inverting input terminal, receiving the input signal;
        an inverting input terminal, coupled to a first terminal of the first resistor and a second terminal of the second resistor; and
        a first output terminal, outputting the amplified signal to the analog-to-digital conversion module;
    wherein a second terminal of the first resistor is coupled to the first output terminal;
    wherein a first terminal of the second resistor is configured to receive the reference signal.

5. The signal-processing circuit as claimed in claim 4, wherein the amplification module further comprises a third resistor;
    wherein a first terminal of the third resistor is coupled to the first terminal of the first resistor, and a second terminal of the third resistor is coupled to a ground terminal.

6. The signal-processing circuit as claimed in claim 1, wherein the second input terminal of the amplification module is configured to receive the reference signal via a voltage follower.

7. The signal-processing circuit as claimed in claim 1, wherein the reference signal is provided by an external voltage source or the analog-to-digital conversion module.

8. The signal-processing circuit as claimed in claim 1, wherein the analog-to-digital conversion module comprises a third operational amplifier, an analog-to-digital conversion core, a fourth resistor, and a fifth resistor;
    wherein the third operational amplifier comprises:
        a third non-inverting input terminal, receiving a supply voltage;
        a third inverting input terminal, coupled to a second terminal of the fourth resistor; and
        a third output terminal, coupled to the analog-to-digital conversion core to supply the reference signal to the analog-to-digital conversion core and the amplification module;
    wherein a first terminal of the fourth resistor is coupled to the third output terminal, and the second terminal of the fourth resistor is coupled to a ground terminal through the fifth resistor.

9. The signal-processing circuit as claimed in claim 1, wherein the amplification module further comprises a first operational amplifier, a first resistor, and a second resistor;
    wherein the first operational amplifier comprises:
        a non-inverting input terminal, receiving the input signal;
        an inverting input terminal, coupled to a first terminal of the first resistor and a first terminal of the second resistor; and
        a first output terminal, outputting the amplified signal to the analog-to-digital conversion module;
    wherein a second terminal of the first resistor is coupled to the first output terminal, and the first terminal of the first resistor and the first terminal of the second resistor is further configured to receive the reference signal;
    wherein a second terminal of the second resistor is coupled to a ground terminal;
    wherein the reference signal is supplied by a current source.

10. The signal-processing circuit as claimed in claim 1, wherein the input signal is between a first threshold value and a second threshold value, wherein the second threshold value is greater than the first threshold value and less than a full conversion scale of the analog-to-digital conversion module;
    wherein $$A1 \leq \frac{V_{REFP}}{TH2 - TH1}$$

$$0 \leq A1*TH1+A2*Vs \leq V_{REFP};$$

$$0 \leq A1*TH2+A2*Vs \leq V_{REFP}$$

wherein A1 and A2 are the first amplification coefficient and the second amplification coefficient, respectively;
wherein TH2 and TH1 are the second threshold value and the first threshold value, respectively;

wherein $V_{REFP}$ is the full scale, and $$\frac{V_{REFP}}{TH2 - TH1}$$

stands for an upper limit of the first amplification coefficient;
wherein when the voltage range of the amplified signal is substantially equal to the conversion scale of the analog-to-digital conversion module, a set of values for the first amplification coefficient, the second amplification coefficient, and the reference signal are selected from a plurality sets of values for the first amplification coefficient, the second amplification coefficient, and the reference signal which satisfy the above limitations;
wherein the selected value of the first amplification coefficient is close to the upper limit.

11. The signal-processing circuit as claimed in claim 10, wherein the full conversion scale is greater than 1 volt;
wherein the first threshold value is greater than 0;
wherein the second threshold value is less than 1.

* * * * *